United States Patent
Namkoong et al.

(10) Patent No.: US 7,888,669 B2
(45) Date of Patent: Feb. 15, 2011

(54) NITRIDE/ZINC OXIDE BASED LIGHT-EMITTING DIODES

(75) Inventors: Gon Namkoong, Yorktown, VA (US); William Alan Doolittle, Hampton, GA (US)

(73) Assignee: Georgia Tech Research Corporation, Atlanta, GA (US)

( * ) Notice: Subject to any disclaimer, the term of this patent is extended or adjusted under 35 U.S.C. 154(b) by 493 days.

(21) Appl. No.: 12/060,633

(22) Filed: Apr. 1, 2008

(65) Prior Publication Data
US 2008/0179587 A1      Jul. 31, 2008

Related U.S. Application Data

(63) Continuation-in-part of application No. 11/939,553, filed on Nov. 14, 2007, now abandoned, and a continuation-in-part of application No. 11/938,764, filed on Nov. 12, 2007, now abandoned.

(51) Int. Cl.
*H01L 29/36* (2006.01)
*H01L 33/26* (2006.01)

(52) U.S. Cl. ................. 257/13; 257/102; 257/103; 257/E33.013

(58) Field of Classification Search ............ 257/13, 257/102, 103, E33.013
See application file for complete search history.

(56) References Cited

PUBLICATIONS

Declaration of Gon Namkoong under 37 CFR § 1.132, dated Sep. 22, 2008.

V. Yu Davydov, A. A. Klochikhin, R. P. Seisyan, V. V. Emtsev, S. V. Ivanov, F. Bechstedt, J. Furthmuller, H. Harima, A. V. Mudryi, J. Aderhold, O. Semchinova, J. Graul, "Absorption of Hexagonal InN. Evidence of Narrow Fundamental Band Gap," Rapid Research Note, phys. stat. sol. (b) 229, No. 3, pp. R1-R3, Feb. 1, 2002, Berlin, Germany.

D.M. Bagnall, Y. F. Chen, Z. Shu, T. Yao, "High Temperature Excitonic Stimulated Emission from ZnO Epitaxial Layers," Applied Physics Letters, vol. 73, No. 8, pp. 1038-1040, Aug. 24, 1998, Japan.

Z. K. Tang, G. K. L. Wong, P. Yu, "Room-Temperature Ultraviolet Laser Emission from Self-Assembled ZnO Microcrystallite Thin Films," Applied Physics Letters, vol. 72, No. 25, pp. 3270-3272, Jun. 22, 1998, Argonne, Illinois.

Soohwan Jang, J. J. Chen, F. Ren, Hyuck-Soo Yang, Sang-Youn Han, D. P. Norton, S. J. Pearton, "Simulation of Vertical and Lateral ZnO Light-Emitting Diodes," J. Vac. Sci. Technol. B 24(2), Mar. 7, 2006, Melville, NY.

Kazunori Minegishi, Yashushi Koiwai, Yukinobu Kirkuchi, Koji Yano, Masanobu Kasuga, Azuma Shimitz, "Growth of p-type Zinc Oxide Films by Chemical Vapor Deposition," Japan J. Appl. Phys, vol. 36 (1997) pp. L 1453-L 1455, Part 2, No. 11A, Nov. 1, 1997, Thorofare, NJ.

(Continued)

*Primary Examiner*—Evan Pert
(74) *Attorney, Agent, or Firm*—Ryan A. Schneider, Esq.; Troutman Sanders LLP (57) ABSTRACT

A light-emitting nitride/zinc oxide based compound semiconductor device of double heterostructure. The double-heterostructure includes a light-emitting layer formed of an $Al_{1-x-y}In_xGa_yN$; $0 \leq x < 1$, $0 < y \leq 1$, and $x+y=0.1$ to 1 compound semiconductor doped an impurity. Single or multi quantum well light-emitting active layers $Al_{1-x-y}In_xGa_yN/GaN$; $0 \leq x < 1$, $0 < y \leq 1$, and $x+y=0.1$ to 1 are positioned between p-type GaN and n-type ZnO substrates.

18 Claims, 4 Drawing Sheets

OTHER PUBLICATIONS

Y. R. Ryu, S. Zhu, D. C. Look, J. M. Wrobel, H. M. Jeong, H. W. White, "Synthesis of p-type ZnO Films," Journal of Growth 216 (2000), pp. 330-334, Jan. 28, 2000, Amsterdam, Netherlands.

D. C. Look, B. Claflin, "P-type Doping and Devices Based on ZnO," phys. stat. sol. (b) 241, No. 3, pp. 624-630, Feb. 16, 2004, Weinheim, Germany.

Atsushi Tsukazaki, Akira Ohtomo, Takeyoshi Onuma, Makoto Ohtani, Takayuki Makino, Masatomo Sumiya, Keita Ohtani, Shigefusa F. Chichibu, Syunrou Fuke, Yusaburou Segawa, Hideo Ohno, Hideomi Kinuma, Masashi Kawasaki, "Repeated Temperature Modulation Epitaxy for p-type Doping and Light-emitting Diode Based on ZnO," Nature Publishing Group, vol. 4, pp. 420-444, Dec. 19, 2004, New York, NY.

David C. Look, "Electrical and Optical Properties of p-type ZnO," Semiconductor Research Center, pp. S55-S61, Mar. 15, 2005, Bristol, UK.

T. Nakayama, M. Murayama, "Electronic Structures of Hexagonal ZnO/GaN Interfaces," Journal of Crystal Growth 214/215 (2000), pp. 299-303, Amsterdam, 2001, Netherlands.

Chris G. Van De Walle, J. Neugebauer, "Universal Alignment of Hydrogen Levels in Semiconductors, Insulators and Solutions," Nature Publishing Group, vol. 423, pp. 626 628,Jun. 5, 2003, New York, NY.

NITRIDE/ZINC OXIDE BASED LIGHT-EMITTING DIODES

CROSS-REFERENCE TO RELATED APPLICATIONS

This patent application is a continuation-in-part claiming priority benefits under 35 U.S.C. §120 to U.S. Nonprovisional application Ser. No. 11/939,553 filed Nov. 14, 2007 and U.S. Nonprovisional application Ser. No. 11/938,764 filed Nov. 12, 2007 which claims priority benefits under 35 U.S.C. §119(e) to U.S. Provisional Application No. 60/858,574 filed Nov. 13, 2006, all of which name Gon Namkoong and William Alan Doolittle as inventors, and which are all incorporated by reference herein.

BACKGROUND OF THE INVENTION

1. Field of the Invention

The present invention relates to a phosphor-free light-emitting heterojunction nitride/zinc oxide based compound semiconductor device. More particularly, it relates to a light-emitting compound semiconductor device implemented by energy band gap engineering of nitride and zinc oxide semiconductor materials to emit longer wavelengths ranging from green to orange to red (a wavelength range of 500-700 nanometers) by changing the composition of a compound semiconductor constituting an active layer.

2. Description of the Related Art

Conventional phosphors used in fluorescent lighting are not ideal for solid-state lighting because they have poor absorption and conversion efficiency. Recently, indium nitride (InN) material has been reported to have a fundamental energy band gap of approximately 0.7 electron-Volts (eV) [V. YU. DAVYDOV et al., "Absorption and Emission of Hexagonal InN. Evidence of Narrow Fundamental Band Gap," Phys. Stat. Solidi, Feb. 1, 2002, (b) 229, R1-R3, Wiley-VCH Verlag Berlin GmbH, 13086 Berlin 2002], which is dramatically smaller than a previously reported band gap of about 1.9 eV for this material. This recent report of a relatively small band gap in InN can offer new opportunities for indium gallium nitride (InGaN) alloys to implement long wavelength light emitters, including yellow and orange/red spectral region. However, these long wavelength LEDs based on nitride quantum well active layers experience higher dislocation density, increased point defects, and severe indium (In) phase separation. Therefore, low internal quantum efficiency is expected for long wavelength LEDs based on nitride materials. Therefore, current technology to produce emitters utilizes conversion of blue or UV light emitters by encapsulating one or two different phosphors to create lower energy photon emission.

The uniqueness of zinc oxide (ZnO) over III-V semiconductor materials including large exciton binding energy [D. M. BAGNALL et al., "High temperature excitonic stimulated emission from ZnO epitaxial layers," Applied Physics Letters, Aug. 24, 1998, Vol. 73, No. 8, pp. 1038-1040, American Institute of Physics, College Park, Md.] and high resistance to radiation damage has attracted much interest to develop high-efficient optical applications such as low threshold UV lasers [Z. K. TANG et al., "Room-temperature ultraviolet laser mission from self-assembled ZnO microcrystallite thin films," Appl. Phys. Lett., Jun. 22, 1998, Vol. 72, No. 25, pp. 3270-3272, America Institute of Physics, College Park, Md.] and short wavelength light-emitting diodes (LEDs) [SOOHWAN JANG et al., "Simulation of vertical and lateral ZnO light-emitting diodes," Journal of Vacuum Science & Technology, pp. 690-694, B 24, 690, American Vacuum Society, New York, N.Y.]. Several researchers have studied p-type ZnO with various dopants [K. MINEGISHI et al., "Growth of p-type zinc oxide films by chemical vapor deposition," Jpn. J. Appl. Phys., Nov. 1, 1997, Vol. 36, pp. L1453-L1455, Part 2, No. 11A, Japanese Journal of Applied Physics, Tokyo, Japan], [RYU, Y. R. et al., "Synthesis of p-type ZnO films," J. Cryst. Growth, Vol. 216, pp. 330-334, Elsevier Science B. V., Amsterdam, The Netherlands]. However, the reliability of p-type ZnO is still controversial [LOOK, D. C. et al., "P-type doping and devices based on ZnO," Phys. Status Solidi, Vol. (b) 241, pp. 624-630, WILEY-VCH Verlag GmbH & Co. KGaA, Weinheim, Germany], and even with successful growth of p-type ZnO, very low hole concentrations [TSUKAZAKI, A. et al., "Repeated temperature modulation epitaxy for p-type doping and light-emitting diode based on ZnO," Nature Materials, Dec. 19, 2004, Vol. 4, pp. 42-44, Nature Publishing Group, London, United Kingdom] and high resistivity [LOOK, D. C., "Electrical and optical properties of p-type ZnO," Semicond. Sci. Technol., Mar. 15, 2005, Vol. 20, pp. S55-S61, IOP Publishing Ltd., Bristol, United Kingdom] are still problems for implementing high-performance of ZnO based applications.

Also of interest to this disclosure, Nakayama et al. described that the calculated valence band offset depends on interface configuration of zinc oxide (ZnO)/gallium nitride (GaN), claiming valence band offset values ranging from 1.0 to 2.2 eV [NAKAYAMA, T. et al., "Electronic structures of hexagonal ZnO/GaN interfaces", J. of Crystal Growth, Jun. 2, 2000, Vol. 214, pp. 299-303, Elsevier Science B. V., Amsterdam, The Netherlands]. Furthermore, VAN DE WALLE, C. G. et al., "Universal alignment of hydrogen levels in semiconductors, insulators and solutions," Nature, Jun. 5, 2003, Vol. 423, pp. 626-628, Nature Publishing Group, London, United Kingdom, indicated that calculated valence band offset was 1.3 and 1.5 eV for GaN/ZnO and InN/ZnO, respectively.

BRIEF SUMMARY OF THE INVENTION

It is therefore an object of the invention to provide a phosphor-free white light-emitting heterojunction nitride/zinc oxide based compound semiconductor device, or more generally, a white light-emitting compound semiconductor device, and a method for making such device. The device and method are implemented through energy band gap engineering of nitride and zinc oxide semiconductor materials to emit longer wavelengths ranging from green to red to orange (a wavelength range of 500-700 nanometers) by changing the composition of a compound semiconductor constituting an active layer of the device.

To overcome the problems noted above with respect to p-type ZnO, an embodiment of the invention comprises an alternative p-type GaN for a heterojunction device to take advantage of the fact that the a-lattice parameter of ZnO ($a_0$=3.250, $c_0$=5.207 Å) is close to that of GaN ($a_0$=3.189, $c_0$=5.185 Å), and that ZnO can be lattice-matched to $In_{0.18}Ga_{0.82}N$. Therefore, p-type GaN, $In_{0.18}Ga_{0.82}N$, and n-ZnO can be interfaced together in a heterojunction device without creating dislocations or other defects at the interfaces between the different materials which would have the undesirable effect of reducing the efficiency of the device.

A heterojunction ZnO/nitride device grown on ZnO substrates and a phosphor-free white luminescence can be achieved according to an embodiment of the invention by engineering the bandgap offset between the Group III element-nitride/ZnO semiconductors. The valence band offset of the nitride/ZnO materials forms a quantum well at the interface between n-type ZnO and the Group III element-nitride which can be used to generate long wavelength such as orange and red color (a wavelength range of 590-700 nm).

In accordance with an embodiment of the invention, a white light-emitting nitride/zinc oxide (ZnO) based compound semiconductor device has a heterostructure comprising an active $Al_{1-x-y}In_xGa_yN$ light-emitting layer; $0 \leq x < 1$, $0 < y \leq 1$, and $x+y=0.1$ to 1. The active light-emitting layer is doped with an impurity, and the active light-emitting layer is structured or formed directly in contact with, or indirectly on, an n-type ZnO substrate. A cladding layer of p-type GaN is situated directly in contact with, or indirectly on, the active light-emitting layer opposite the n-type ZnO substrate.

In this embodiment, the compound semiconductor of the cladding layer can be p-type, doped with a p-type impurity such as a Group II or/and Group IV element. The p-type dopant concentration in the cladding layer can be in a range from $1 \times 10^{17}$ to $1 \times 10^{21}$ atoms per cubic centimeter (atoms/cm$^3$). The thickness of the cladding layer can be in a range from $10 \times 10^{-10}$ to $0.5 \times 10^{-6}$ meter. The active light-emitting layer can be n-type, doped with at least an n-conductivity type impurity such as one or more Group III elements. The n-type dopant concentration in the active light-emitting layer can be in a range of $1 \times 10^{17}$ to $1 \times 10^{21}$ atoms/cm$^3$. Alternatively, the impurity doped in the compound semiconductor of said active light-emitting layer can comprise both n-type and p-type impurities, and the n-type impurity can comprise a Group VI element and the p-type impurity can comprise a Group II element. In this configuration, the n-type dopant concentration in the active light-emitting layer can be in a range from $1 \times 10^{17}$ to $10^{21}$ atoms/cm$^3$, and the p-type dopant concentration in the active light-emitting layer can be in a range from $1 \times 10^{17}$ to $1 \times 10^{21}$ atoms/cm$^3$. The light-emitting layer can have a thickness in a range from $10 \times 10^{-10}$ to $0.5 \times 10^{-6}$ meter. The ZnO layer or substrate can be intrinsically n-type, or it may be doped n-type using one or more Group III elements. The n-type dopant in the ZnO layer or substrate can be in a concentration of from $1 \times 10^{17}$ to $1 \times 10^{21}$ atoms/cm$^3$. The device can have a double heterostructure configuration with an n-type ZnO contact layer joined or electrically connected to the active light-emitting layer via the n-ZnO substrate, and a p-type GaN contact layer joined or electrically connected to the active light-emitting layer via the p-type GaN cladding layer. The p-type and n-type contact layers can be used as terminals to connect to a voltage source to stimulate emission of light from the active light-emitting layers of the device. A metal layer composed of tantalum or tantalum alloys, or combinations thereof, with other metals can be joined or formed in contact with the back side of the n-ZnO layer or substrate in order to facilitate or control heating of the device during its manufacture.

In another embodiment, a light-emitting heterojunction nitride/zinc oxide-based compound semiconductor device has a heterostructure comprising: a first light-emitting layer formed of a low-resistivity $Al_{1-x-y}In_xGa_yN$; $0 \leq x < 1$, $0 < y \leq 1$, and $x+y=0.1$ to 1 compound semiconductor doped with an n-type impurity; a second active light-emitting layer joined or electrically connected to said first light-emitting layer having a low-resistivity $Al_{1-l-m}In_lGa_mN$; $0 \leq l < 0 < 1$, $0 < m \leq 1$, and $l+m=0.1$ to 1 composition that is different from that of the compound semiconductor of the first light-emitting layer and doped with a p-type impurity; a cladding layer of p-type GaN-based compound semiconductor in contact with or electrically connected to the first light-emitting layer; and an n-type zinc oxide-based compound semiconductor in contact with or electrically connected to the second light-emitting layer. Multiple first and second active light-emitting layers can be joined or electrically coupled together in alternation to form a multiple quantum well (MQW) structure. The n-type impurity in the compound semiconductor of the first light-emitting layer can be a Group IV element such as Si. The p-type impurity doped in said compound semiconductor of said light-emitting layer can comprise at least one element selected from the group consisting of magnesium (Mg), zinc (Zn), beryllium (Be), and carbon (C), and combinations thereof. The concentration of the p-type or n-type dopant can be in a range from $1 \times 10^{17}$ to $1 \times 10^{21}$ atoms/cm$^3$. The thickness of each of the first and second light-emitting layers can be in a range from $1 \times 10^{-10}$ to $1 \times 10^{-7}$ meters, and the combined thickness of these layers can be in a range from $10 \times 10^{-10}$ to $0.5 \times 10^{-6}$ meter. The cladding layer can have a thickness in a range from $10 \times 10^{-10}$ to $0.5 \times 10^{-6}$ meter. The ZnO layer or substrate can have a thickness in a range from $10 \times 10^{-10}$ to $1000 \times 10^{-6}$ meter. The ZnO layer or substrate can be intrinsically n-type, or it may be doped to be n-type using one or more dopants such as Ga, In, and Al. The concentration of the n-type dopant can be in a range from $1 \times 10^{17}$ to $1 \times 10^{21}$ atoms/cm$^3$. The heterostructure can have an n-type ZnO contact layer in contact with or electrically connected to the n-type ZnO layer or substrate, and a p-type GaN contact layer in contact with or electrically connected to the p-type GaN layer. The p-type and n-type contact layers can be used as terminals to connect to a voltage source to stimulate emission of light from the active light-emitting layers of the device. A metal layer composed of tantalum can be joined or formed in contact with the back side of the n-ZnO layer or substrate in order to facilitate or control heating of the device during its manufacture.

Other objects and advantages provided by the present invention will become apparent from the following Detailed Description of the Invention taken in conjunction with the Drawing, in which:

DETAILED DESCRIPTION OF THE PREFERRED EMBODIMENTS

A detailed description of various embodiments of the device structures and methods of making such structures are provided below. The device 10 can be formed using a sputtering system, molecular beam epitaxy (MBE) system, metal organic chemical vapor deposition (MOCVD) system, hydride or halide vapor phase epitaxy (HVPE) system or other suitable system using known techniques. Suitable reactants, precursors, inert gases, etchants, resists, developers, mass flow controllers and other equipment necessary to make the device 10 as described herein are known in the art or can be readily employed based on the subject specification.

Structure of Light-Emitting Device with Homogeneous Active Layer

Figure 1:
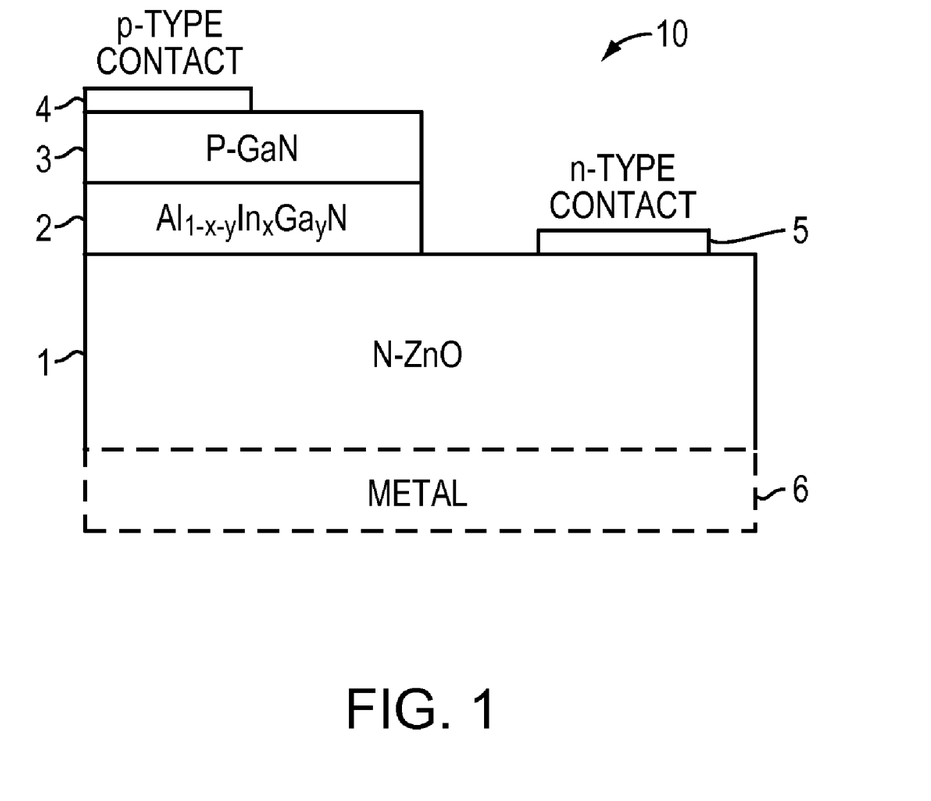
FIG. 1 is an exemplary schematic view of embodiments of the invention comprising a device structure having an n-type layer comprised of zinc oxide (n-ZnO layer), an aluminum indium gallium nitride layer ($Al_{1-x-y}In_xGa_yN$ layer; $0 \leq x < 1$, $0 < y \leq 1$, and $x+y=0.1$ to 1, and a p-type gallium nitride (p-GaN) layer.

As shown in FIG. 1 the device 10 comprises an n-type zinc oxide (n-ZnO) layer or substrate 1, an active light-emitting layer 2 composed of $Al_{1-x-y}In_xGa_yN$; $0 \leq x < 1$, $0 < y \leq 1$, and x+y=0.1 to 1, and a p-type gallium nitride (p-GaN) layer 3. The n-ZnO layer 1 is positioned in direct contact with the $Al_{1-x-y}In_xGa_yN$ layer 2. Alternatively, the n-ZnO layer 1 may be positioned indirectly in contact with the $Al_{1-x-y}In_xGa_yN$ layer 2, but in electrical connection with it through one or more intermediate layers (not shown). Similarly, the n-type gallium nitride (n-GaN) layer 3 can be positioned in direct contact with the $Al_{1-x-y}In_xGa_yN$ layer, or it may be positioned indirectly in contact with such layer through one or more intermediate layers (not shown) interposed between the two layers 2, 3 to form an electrical connection between these layers.

The n-ZnO layer or substrate 1 can be structured as an epitaxial layer, or alternatively, it can be in bulk form. The n-ZnO layer 1 serves as the n-type layer The ZnO layer or substrate is highly pure, at least 99.99% pure or more. In addition, the ZnO layer or substrate should have no more than $1 \times 10^8$ defects per square centimeter, and fewer if possible. The thickness of the n-ZnO layer or substrate 1 is in a range from 1 to 500 micrometers. Because ZnO is inherently n-type, it need not be doped at all to achieve n-type conductivity. However, n-type conductivity can be increased through the addition of dopants such as Ga, In, Al or B. Concentration of the dopants can be in a range from $1 \times 10^{17}$ to $1 \times 10^{21}$ atoms/cm$^3$. The n-ZnO layer or substrate 1 is cut with an orientation of $(10^{-10})$, (11-20) or (0002) and polished to a surface roughness of 10 angstroms (root mean squared) or less before forming the $Al_{1-x-y}In_xGa_yN$ layer 2 or intermediate layer thereon. The refractive index of the n-ZnO layer 1 can be made less than that of the $Al_{1-x-y}In_xGa_yN$ layer 2 in order to confine light to a degree within such layer. This permits light generated within the layer 2 to stimulate spontaneous emission of photons from other energy states within such layer 2. Of course, the refractive index difference between the ZnO layer 1 and the $Al_{1-x-y}In_xGa_yN$ layer 2 is not so great as to prevent a significant amount of light from ultimately escaping from the device 10 as the purpose of device is, after all, to emit light.

The $Al_{1-x-y}In_xGa_yN$ layer 2 can be structured as an epitaxial layer formed on the n-ZnO layer or substrate 1. The $Al_{1-x-y}In_xGa_yN$ active layer 2 can be n-type, doped with at least an n-conductivity type impurity such as one or more Group III elements. The n-type dopant concentration in the active light-emitting layer can be in a range from $1 \times 10^{17}$ to $1 \times 10^{21}$ atoms/cm$^3$. Alternatively, the impurity doped in the compound semiconductor of said active light-emitting layer can comprise both n-type and p-type impurities, and the n-type impurity can comprise a Group IV element and the p-type impurity can comprise a Group II or/and Group IV element. In this configuration, the n-type dopant concentration in the active light-emitting layer can be in a range from $1 \times 10^{17}$ to $1 \times 10^{21}$ atoms/cm$^3$, and the p-type dopant concentration in the active light-emitting layer can be in a range from $1 \times 10^{17}$ to $1 \times 10^{21}$ atoms/cm$^3$. The light-emitting layer can have a thickness in a range from $10 \times 10^{-10}$ to $0.5 \times 10^{-6}$ meter.

The p-type GaN cladding layer 3 can be structured as an epitaxial layer formed on the $Al_{1-x-y}In_xGa_yN$ layer 2. The p-type GaN layer 3 can be p-type, doped with a p-type impurity such as a Group II element. The p-type dopant concentration in the cladding layer can be in a range from $1 \times 10^{17}$ to $1 \times 10^{21}$ atoms/cm$^3$. The thickness of the cladding layer can be in a range from $10 \times 10^{-10}$ to $0.5 \times 10^{-6}$ meters. To perform its cladding function, the refractive index of the cladding layer 3 should be less than that of the $Al_{1-x-y}In_xGa_yN$ layer 2. As such, light generated in the active layer 2 tends to be confined in this layer at least temporarily to stimulate further emission, thereby increasing the intensity of light emitted by the device 10.

The p-type contact layer 4 is formed in contact with the p-GaN layer 4 and serves to make an electrical connection to such layer. The p-type contact layer 4 is an Ohmic contact composed of metal or metal alloy that is highly transparent, so that light from the active layer 2 can escape through the p-type contact layer 4 without being appreciably absorbed. As a material to use for the p-type contact layer 4, the inventors have found that nickel-gold (Ni/Au) alloy provides an excellent transparent contact to the p-type GaN layer 3. However, nickel (Ni), nickel-silver (Ni/Ag), palladium-gold (Pd/Au), and nickel-chromium-gold (Ni/Cr/Au) are also suitable materials to use for the p-type contact layer 4.

The n-type contact layer 5 is formed in contact with the n-ZnO layer or substrate 1 and can be composed of various metals or alloys. The n-type contact layer 5 is an Ohmic contact that provides an electrical connection to the n-ZnO layer or substrate 1. Titanium-gold (Ti/Au) alloy provides an excellent contact to the n-ZnO layer or substrate 1, but titanium (Ti), tantalum (Ta), tantalum-gold (Ta/Au), and titanium-silver-titanium-gold (Ti/Ag/Ti/Au) can be used.

A metal layer 6 can be formed on the backside of the n-ZnO layer 1. It is shown in broken line in FIG. 1 to indicate it is an optional feature of the device 10. The metal layer 6 can be used to facilitate heating of the device 10 during its manufacture. It can be composed of tantalum or other high-temperature metal. The metal layer 6 may also be used for grounding of the device 10.

In some embodiments, the $Al_{1-x-y}In_xGa_y$ N layer 2 can be structured to take advantage of the fact that the a-lattice parameter of ZnO ($a_{0=3.250}$, $c_{0=5.207}$ Å) is close to that of GaN ($a_{0=3.189}$, $c_{0=5.185}$ Å), and ZnO can be lattice-matched to $In_{0.18}Ga_{0.82}N$. This structure reduces the number of dislocations or other defects at the boundaries between the layers which could serve as traps for electrons or holes and thus degrade device performance.

The layers 1-3 are structured to be integral with one another so that transitions are abrupt between the layers 1, 2 and 2, 3 or any intermediate layer that may be used between these layers. Similarly, the contact layers 4, 5 are structured to be annealed or sintered to the p-GaN layer 3 and the n-ZnO layer 1, respectively, to form an integrated structure. Likewise, if used, the metal layer 6 is structured to be in integral contact with the n-ZnO layer or substrate 1 to provide good heat transfer there between.

Method of Making Light-Emitting Device Having Homogeneous Active Layer

Figure 2:
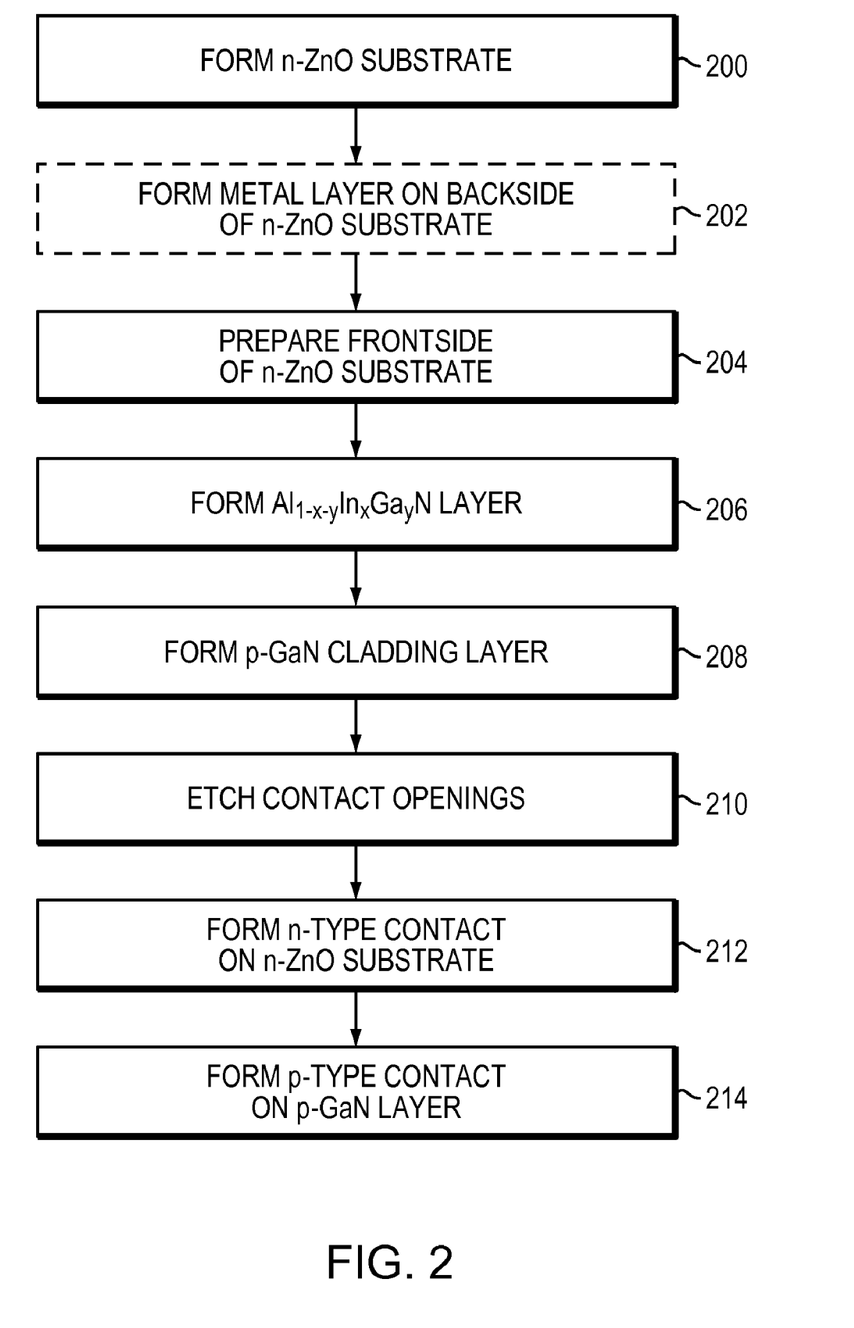
FIG. 2 is a method of making the device structure of FIG. 1.

In FIG. 2 a method of making the device 10 of FIG. 1 having a homogeneous active layer 2 is disclosed. In Step 200 of FIG. 2 the n-ZnO layer or substrate 1 is formed. The n-ZnO layer or substrate 1 can be produced in bulk form with high purity using the methods and equipment of U.S. Pat. Nos. 5,863,326 and 5,900,060, which are incorporated herein by reference. A bulk ZnO crystal produced according to these methods can be cut with a diamond saw and polished with a grinder. Alternatively, or in addition to the above, the n-type ZnO layer 1 can be epitaxially formed on a ZnO, sapphire or other substrate using Molecular Beam Epitaxy (MBE) system, Metal Organic Chemical Vapor Deposition (MOCVD) system, or a Hydride or Halide Vapor Phase Epitaxy (HVPE) system. Growth temperature for the layer 1 should be from 100-700 degrees Celsius to prevent oxygen from decomposing out of the solid ZnO lattice. In general, it is desirable that any step of the method involving heating of the device 10 should be performed at or below 700 degrees Celsius in order to prevent decomposition of oxygen from solid-state ZnO unless sufficient overpressure is applied to prevent decomposition at higher temperatures.

In Step 202 of FIG. 2, a metal layer 6 can be formed on the backside of the n-ZnO layer or substrate 1. This step can be performed by sputtering tantalum or other high-temperature metal on the backside of the layer or substrate 1 using a sputtering chamber and source at room temperature. The metal layer 6 can be formed with a thickness of from $10 \times 10^{-10}$ to $5 \times 10^{-7}$ meters. The metal layer 6 absorbs heat and can be used to heat the device 10 in a vacuum environment.

In Step 204 of FIG. 2, the front side of the n-ZnO layer or substrate 1 is prepared for deposition of the active layer 2 cleaned using standard solvents such as trichloroethylene (TCL), acetone and methanol applied in this order.

In Step 206 of FIG. 2, the $Al_{1-x-y}In_xGa_yN$ active layer 2 is formed on the n-ZnO layer or substrate 1 (or any intermediate layer). The $Al_{1-x-y}In_xGa_yN$ active layer 2 can be formed using a Molecular Beam Epitaxy (MBE) system, Metal Organic Chemical Vapor deposition (MOCVD) system, or a Hydride or Halide Vapor Phase Epitaxy (HVPE) system. Growth temperature for the active layer 2 should be from 100-700 degrees Celsius. MBE uses specified growth fluxes as pressures described as beam equivalent pressures (BEP). The ranges of Al, Ga, In and N BEP range from $1 \times 10^{-9}$ to $5 \times 10^{-6}$ torr and nitrogen plasma flow from 0.1 to 5 standard cubic centimeters per minute (sccm) through a nitrogen plasma source using 50-1200 watts. Alternatively the nitrogen can be supplied in the form of ammonia at flow rates of 0.5-100 sccm.

In Step 208 of FIG. 2, the p-type GaN cladding layer 3 is formed using MBE, MOCVD, or HVPE using appropriate effusion cells or precursor sources to provide the Ga and N atoms, and p-type dopant atoms. The p-type dopant can be Mg, for example, provided in sufficient amount to produce the cladding layer 3 with a dopant concentration in a range from $1 \times 10^{19}$ to $1 \times 10^{21}$ atoms per cubic centimeter (atoms/cm$^3$). In alternative embodiments, it is possible that the cladding layer 3 can be n-type instead of p-type through use of a dopant such as silicon (Si). The dopant (Mg or Si, for example) can be supplied by a standard effusion cell. The BEP for such cell can be in a range from $1 \times 10^{-11}$ to $1 \times 10^{-9}$ torr. As explained, the temperature during formation of the cladding layer 3 should be from 100-700 degrees Celsius to avoid decomposition of oxygen from the ZnO layer or substrate 1.

In Step 210 of FIG. 2, a contact opening to the n-ZnO layer or substrate 1 is formed by partially etching away the layers 2, 3 to expose the ZnO layer or substrate 1. An inductively coupled plasma etching tool can be used for this purpose.

In Step 212 of FIG. 2, an n-type contact layer 5 is formed in contact with the n-ZnO layer or substrate 1 (or an intermediate layer in electrical contact with the layer 3) to form an electrical connection thereto. The n-type contact layer 5 can be composed of titanium-gold (Ti/Au), titanium (Ti), tantalum (Ta), tantalum-gold (Ta/Au), and titanium-silver-titanium-gold (Ti/Ag/Ti/Au). The contact layer 5 can be deposited by electron beam evaporation or thermal evaporation technique. Thermal treatment is performed in an ambient containing nitrogen (N) or oxygen (O). The annealing temperature is in a range from 300 to 600 degrees Celsius. The A p-type electrode 4 was formed on the cladding layer while an n-type electrode 5 was formed directly on ZnO substrates.

In Step 214 of FIG. 2, a p-type contact layer 4 is formed in contact with the p-GaN cladding layer 3 (or an intermediate layer in electrical contact with the layer 3). As previously described, the p-type contact layer 4 is an ohmic contact composed of highly transparent metal or metal alloy so that light from the active layer 2 can escape through the p-type contact layer 4 without being appreciably absorbed. Nickel-gold (Ni/Au), nickel (Ni), nickel-silver (Ni/Ag), palladium-gold (Pd/Au), and nickel-chromium-gold (Ni/Cr/Au) are also suitable materials to use for the p-type contact layer 4.

Figure 3:
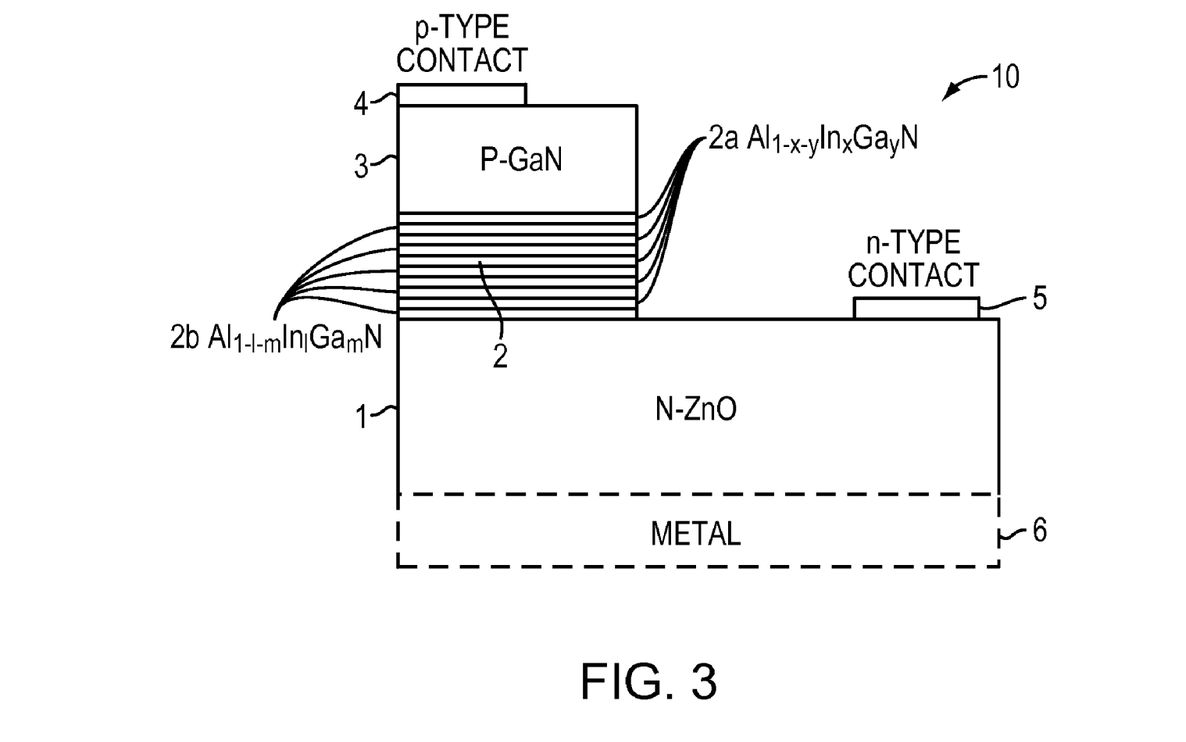
FIG. 3 is an exemplary schematic view of embodiments of the invention comprising a device structure having an n-type layer comprised of zinc oxide (n-ZnO layer), at least first and second layers of aluminum indium gallium nitride ($Al_{1-x-y}In_xGa_yN$ layer; $0 \leq x < 1$, $0 < y \leq 1$, and $x+y=0.1$ to 1) having different composition, thereby forming a multiple quantum well (MQW) structure, and a p-type gallium nitride (p-GaN) layer.

Structure of Light-Emitting Device with Multiple Quantum Well (MQW) Active Layer The structure of device 10 shown in FIG. 3 is similar in all respects to that of FIG. 1 and so description of this redundant material is omitted for simplicity and clarity of the disclosure. The chief difference in structure lies in the configuration of the active layer 2. In the embodiment of FIG. 3, the active layer 2 is composed of semiconductor layers of different composition forming a multiple quantum well (MQW) structure. More specifically, the MQW structure is formed of a first light-emitting layer 2a of a low-resistivity $Al_{1-x-y}In_xGa_yN$; $0 \leq x < 1$, $0 < y \leq 1$, and $x+y=0.1$ to 1 compound semiconductor doped with an n-type impurity; and a second active light-emitting layer 2b joined or electrically connected to said first light-emitting layer 2a and having a low-resistivity $Al_{1-l-m}In_lGa_mN$; $0 \leq l < 1$, $0 < m \leq 1$, and $1+m=0.1$ to 1. The variables x and y, and l and m, respectively, are different, reflecting the different compositions of the first and second layers 2a, 2b. The first light-emitting layer 2a can be doped with a p-type impurity. The p-type impurity doped in said compound semiconductor of said light-emitting layer can comprise at least one element selected from the group consisting of magnesium (Mg), zinc (Zn), beryllium (Be) and carbon (C), and combinations thereof. The cladding layer 3 of p-type GaN-based compound semiconductor is situated in contact with, or electrically connected to, the first light-emitting layer 2a. The n-type zinc oxide-based compound semiconductor layer or substrate 1 is situated in contact with, or is electrically connected to, the second light-emitting layer 2b. The n-type impurity in the compound semiconductor of the first light-emitting layer can be a Group IV element such as Si. Multiple first and second active light-emitting layers 2a, 2b can be joined or electrically coupled together in alternation to form a multiple quantum well (MQW) structure. From two to ten first and second layers 2a, 2b can be used for the MQW structure. The concentration of the p-type or n-type dopant can be in a range from $1 \times 10^{17}$ to $1 \times 10^{21}$ atoms/cm$^3$. The thickness of each of the first and second light-emitting layers can be in a range from $1 \times 10^{-10}$ to $1 \times 10^{-7}$ meter, and the combined thickness of these layers can be in a range from $10 \times 10^{-10}$ to $1000 \times 10^{-6}$ meter. In other respects, the embodiment of the device 10 as shown in FIG. 3 is similar to that described in FIG. 1.

Figure 4:
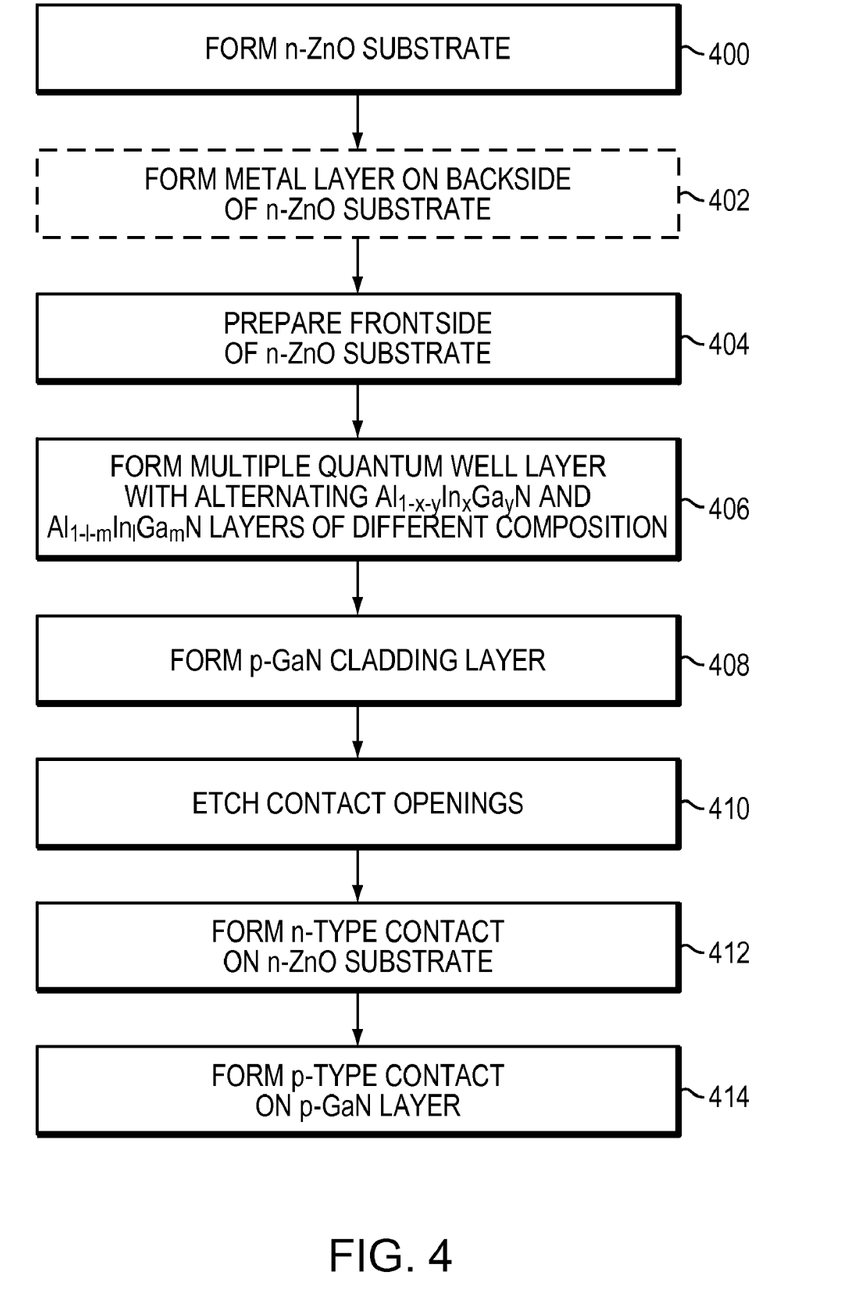
FIG. 4 is a method of making the device of FIG. 3.

Method of Making Light-Emitting Device Having Multiple Quantum Well (MQW) Active Layer FIG. 4 shows a method of making a light-emitting device 10 having a multiple quantum well (MQW) structure. The method of FIG. 4 mirrors that of FIG. 2 in that Steps 400-404 and 408-414 can be identical to respective Steps 200-204 and 208-214. The significant difference is with respect to Step 406 in which a multiple quantum well structure with alternating first and second light emitting layers 2a, 2b of different compositions are formed.

The $Al_{1-x-y}In_xGa_yN$ active layer 2a and $Al_{1-l-m}In_lGa_mN$ active layer 2b can be formed using a Molecular Beam Epitaxy (MBE) system, Metal Organic Chemical Vapor deposition (MOCVD) system, or a Hydride or Halide Vapor Phase Epitaxy (HVPE) system. As with all Steps involving a thermal cycle, growth temperature for the active layers 2a, 2b should maintained in a range from 100-700 degrees Celsius to avoid decomposition of the ZnO substrate or layer 1. The ranges of Al, Ga, In and N BEP range from $1 \times 10^{-9}$ to $5 \times 10^{-6}$ torr and nitrogen plasma flow from 0.1 to 5 standard cubic centimeters per minute (sccm) through a nitrogen plasma source using 50-1200 watts. Alternatively the nitrogen can be supplied in the form of ammonia at flow rates of 0.5-100 sccm. The $Al_{1-x-y}In_xGa_yN$ active layer 2a can be doped with a p-type impurity selected from the group consisting of magnesium (Mg), zinc (Zn), and carbon (C), and combinations thereof. For MBE such dopants are provided at a BEP range from $1 \times 10^{-11}$ to $1 \times -8$ Torr. For MOCVD or HVPE, such dopants can be supplied as precursors of diethylzinc, or Bis cyclopentadienyl magnesium at a flow rate of 50 sccm to 1000 sccm. The n-type impurity in the compound semiconductor of the first light-emitting layer can be a Group IV element such as Si. For MBE such dopants are provided at a BEP range from $1 \times 10^{-11}$ to $1 \times 10^{-9}$ Torr. The concentration of the p-type or n-type dopant can be in a range from $1 \times 10^{17}$ to $1 \times 10^{21}$ atoms/cm$^3$. From two to ten alternating layers are formed with the uppermost layer 2a in contact with the p-GaN cladding layer 3 and the lowermost layer 2b in contact with the n-ZnO substrate or layer 1. The thickness of each of the first and second light-emitting layers 2a, 2b is grown in a range from $1 \times 10^{-10}$ to $1 \times 10^{-7}$ atoms/cm$^3$, and the combined thickness of these layers can be in a range from $10 \times 10^{-10}$ to $0.5 \times 10^{-6}$ meter. In other respects, the embodiment of the method of FIG. 4 is similar to that described in FIG. 2.

Specific Examples of Growth of the Light-Emitting Active Layer

The growth of the light-emitting active layer 2 was achieved by maintaining the ZnO substrate 1 temperature at 473 degrees C., with a nitrogen plasma gas at a flow rate of 0.5 sccm, and Ga flux as solid Ga source $1.0 \times 10^{-7}$ torr, In flux as solid In source $0.7 \times 10^{-7}$ torr were supplied. Thus, active InGaN layer 2 was grown on ZnO substrate 1, having a thickness of $400 \times 10^{-10}$ meter. The tool used to grow the active layer 2 was the Riber 32 although virtually any other MBE tool can be used. Growth of the active layer 2 can be achieved under the stated process parameters in 0.5 to 2.0 hours.

The growth of a second cladding layer 3 was formed after the active light-emitting layer 2 was formed. The second cladding layer 3 was grown by maintaining the substrate at 550. degrees C. to grow a p-type cladding layer 3. The p-type cladding layer 3 was achieved using Mg doped GaN by introducing gallium and nitrogen plasma gas with p-type dopants of Mg.

To fabricate a light-emitting diode structure 10 the cladding layer 3 and the active light-emitting layer 2 of the wafer obtained above were partially etched away to expose ZnO substrate 1. An inductively coupled plasma etching tool can be used for this purpose. An ohmic contact p-type electrode 4 was formed on the cladding layer while an n-type electrode 5 was formed directly on ZnO substrate 1. The light-emitting diode 10 obtained above had multi-peak wavelength, illuminating white light emission.

In accordance with an alternate embodiment, the cleaning of a substrate 1 was performed following the same procedures as in the embodiment of the first example. Growth of the active layer 2 was conducted as follows. While ZnO substrate 1 temperature was maintained at 473 degrees C., a nitrogen plasma gas at a flow rate of 0.5 sccm, a Ga flux as solid Ga source $1.0 \times 10^{-7}$ torr, and an In flux as solid In source $0.7 \times 10^{-7}$ torr were supplied to the substrate 1. Thus, active InGaN layer 2 was grown on ZnO substrate 1, having a thickness of $40 \times 10^{-10}$ m. The remaining steps were the same as previously described for the first embodiment to form the light-emitting diode 10.

In accordance with an alternate embodiment, the cleaning of a substrate 1 was performed following the same procedures as the embodiment of the first example. Growth of the active layer 2 was conducted as follows. While ZnO substrate 1 temperature was maintained at 473 degrees C., a nitrogen plasma gas at a flow rate of 0.5 sccm, a Ga flux as solid Ga source $1.0 \times 10^{-7}$ torr, and In flux as solid In source $0.7 \times 10^{-7}$ torr were supplied to the substrate 1. Multi-quantum active InGaN/GaN layers 2a, 2b were grown on ZnO substrate 1, having a thickness of $40 \times 10^{-10}$ m. and $40 \times 10^{-10}$ m for InGaN and GaN. Two to ten layers 2a, 2b were grown. The growth rates were 0.1-1.3 μm/hour. The remaining steps were the same as previously described for the first embodiment to form the light-emitting diode 10.

In accordance with an alternate embodiment, the cleaning of a substrate 1 was performed following the same procedures as in the embodiment of the first example. Growth of the active layer 2 was conducted as follows. ZnO substrates 1 were doped with indium or aluminum or gallium to get highly conductive n-type substrate at a concentration of $1 \times 10^{20}$/cm$^3$. The growth of active light-emitting layer 2 and p-type cladding layer 3 were performed following the same procedure as in the first example, to prepare a white light-emitting diode 10.

In operation, a voltage potential, 3-4 volts for example at currents depending upon the size of the device, is electrically applied to the contacts 4, 5 to cause the device 10 to emit light in the wavelength range for which the device 10 is designed. As described, the emitted wavelength range can be such as to appear like white light emitted from an incandescent source, for example. Thus, the device 10 can be used as a white light source for lighting or other applications.

Although the invention has been explained by way of some specific embodiments, modifications or changes may be made therein by those skilled in this art. For example, the relative proportions of reactants, the relative BEP or flow rates of the reactive gases, the recited temperatures, pressures and ambient, and the relative layer thicknesses obtained may be varied as desired for particular applications and purposes. All such obvious changes may be made herein by those skilled in this art without departing from the scope and spirit of this invention.

Many modifications and other embodiments of the inventions set forth herein will come to mind to one skilled in the art to which these inventions pertain having the benefit of the teachings presented in the foregoing descriptions and the associated drawings. Therefore, it is to be understood that the inventions are not to be limited to the specific embodiments disclosed and that modifications and other embodiments are intended to be included within the scope of the appended claims. Although specific terms are employed herein, they are used in a generic and descriptive sense only and not for purposes of limitation.

That which is claimed:

1. A white light-emitting nitride/zinc oxide (ZnO) based compound semiconductor device having a heterostructure comprising:
   an active $Al_{1-x-y}In_xGa_yN$ light-emitting layer; $0 \leq x < 1$, $0 < y \leq 1$, and x+y=0.1 to 1;
   an n-type ZnO substrate; and
   a cladding layer of p-type GaN,
   said active light-emitting layer situated or formed directly or indirectly on or in contact with said n-type ZnO substrate, and the cladding layer of p-type GaN situated or formed directly or indirectly on or in contact with the active light-emitting layer,
   said compound semiconductor device doped with an impurity.

2. The device according to claim 1, wherein said compound semiconductor of said cladding layer is of p-type, doped with a p-type impurity.

3. The device according to claim 2, wherein said p-type impurity comprises a Group II or Group IV element.

4. The device according to claim 1, wherein said compound semiconductor of said active light-emitting layer is of n-type, doped with at least an n-conductivity type impurity.

5. The device according to claim 1, wherein said impurity doped in said compound semiconductor of said active light-emitting layer comprises a p-type impurity including a Group II or/and Group IV element and an n-type impurity including a Group IV element.

6. The device according to claim 1, wherein said compound semiconductor of said light-emitting layer is of n-type, doped with n-type impurity.

7. The device according to claim 6, wherein said n-type impurity comprises one or more group III elements.

8. The device according to claim 1, wherein said compound semiconductor or active light-emitting layer is represented by the formula $Al_{1-x-y}In_xGa_yN$; $0 \leq x < 1$, $0 < y \leq 1$, and x+y=0.1 to 1.

9. The device according to claim 1, wherein said light-emitting layer has a thickness of $10 \times 10^{-10}$ m to $0.5 \times 10^{-6}$ m.

10. The device according to claim 1, wherein said double-heterostructure has an n-type ZnO contact layer joined to said first active light-emitting layer, and a p-type GaN contact layer joined to said active light-emitting layer.

11. A light-emitting heterojunction nitride/zinc oxide-based compound semiconductor device having a heterostructure comprising:
    a light-emitting layer formed of a low-resistivity $Al_{1-x-y}In_xGa_yN$; $0 \leq x < 1$, $0 < y \leq 1$, and x+y=0.1 to 1 compound semiconductor doped with a n-type impurity;
    an active light-emitting layer joined to an n-type zinc oxide-based compound semiconductor having a composition different from that of said compound semiconductor of said light-emitting layer; and
    a cladding layer joined to said active light-emitting layer and formed of a low-resistivity, p-type GaN-based compound semiconductor.

12. The device according to claim 11, wherein said p-type impurity doped in said compound semiconductor of said light-emitting layer comprises at least one element selected from the group consisting of magnesium, zinc, beryllium and carbon, and combinations thereof.

13. The device according to claim 11, wherein said compound semiconductor of said active light-emitting layer is represented by a formula: $Al_{1-x-y}In_xGa_yN$; $0 \leq x < 1$, $0 < y \leq 1$, and x+y=0.1 to 1.

14. The device according to claim 11, wherein said compound semiconductor of said p-type cladding layer is represented by a formula: $Al_{1-l-m}In_lGa_mN$; $0 \leq l < 1$, $0 < m \leq 1$, and l+m=0.1 to 1.

15. The device according to claim 11, wherein said light-emitting layer has a thickness of $10 \times 10^{-10}$ m to $0.5 \times 10^{-6}$ m.

16. The device according to claim 11, wherein said p-type impurity doped in said compound semiconductor of said light-emitting layer comprises magnesium, and a concentration of the magnesium is $1 \times 10^{17}$ to $1 \times 10^{21}$/cm$^3$.

17. The device according to claim 11, wherein said cladding layer has a thickness of $0.05 \times 10^{-6}$ m to $1.5 \times 10^{-6}$ m.

18. The device according to claim 11, wherein said heterostructure has an n-type ZnO contact layer, and a p-type GaN contact layer joined to said active light-emitting layer.

* * * * *